(12) United States Patent
Bratkovski et al.

(10) Patent No.: US 7,941,015 B2
(45) Date of Patent: May 10, 2011

(54) RING LIGHT EMITTING DIODE

(75) Inventors: Alexandre Bratkovski, Mountain View, CA (US); Sagi Mathal, Palo Alto, CA (US); Michael Tan, Menlo Park, CA (US); David Fattal, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 169 days.

(21) Appl. No.: 12/262,142

(22) Filed: Oct. 30, 2008

(65) Prior Publication Data

US 2010/0111462 A1 May 6, 2010

(51) Int. Cl.
*G02B 6/26* (2006.01)
*G02B 6/42* (2006.01)

(52) U.S. Cl. ................ 385/32; 385/30; 385/40

(58) Field of Classification Search ............. 385/40, 385/30, 32, 34
See application file for complete search history.

(56) References Cited

U.S. PATENT DOCUMENTS

| | | | |
|---|---|---|---|
| 6,534,798 B1 | 3/2003 | Scherer et al. | |
| 7,038,373 B2 | 5/2006 | Arnold et al. | |
| 7,184,632 B2 * | 2/2007 | de Almeida et al. | 385/50 |
| 7,696,477 B2 * | 4/2010 | Sigalas et al. | 250/306 |
| 7,876,444 B2 * | 1/2011 | Fattal et al. | 356/445 |
| 2003/0180029 A1 * | 9/2003 | Garito et al. | 385/142 |
| 2004/0023396 A1 * | 2/2004 | Boyd et al. | 435/872 |
| 2005/0269578 A1 | 12/2005 | Barnes et al. | |
| 2006/0072875 A1 * | 4/2006 | Bhagavatula et al. | 385/30 |
| 2006/0215949 A1 * | 9/2006 | Lipson et al. | 385/2 |
| 2010/0019252 A1 * | 1/2010 | Bratkovski et al. | 257/80 |
| 2010/0098372 A1 * | 4/2010 | Manipatruni et al. | 385/2 |

FOREIGN PATENT DOCUMENTS

| | | |
|---|---|---|
| GB | 2390215 A | 12/2003 |
| WO | 03019245 A2 | 3/2003 |
| WO | 2005045949 A1 | 5/2005 |
| WO | 2007030458 A2 | 3/2007 |

OTHER PUBLICATIONS

Sun, Greg et al.; "Practicable Enhancement of Spontaneous Emission Using Surface Plasmons"; Applied Physics Letter; Mar. 14, 2007; 90; American Institute of Physics.
Neogi, Arup et al.; "Enhancement of Spontaneous Recombination Rate in a Quantum Well by Resonant Surface Plasmon Coupling"; Physical Review B; Oct. 4, 2002; 66; The American Physical Society.
Hecker, N. E. et al.; "Surface Plasmon-Enhanced Photoluminescence from a Single Quantum Well"; Applied Physics Letter; vol. 75; No. 11; Sep. 13, 1999; American Institute of Physics.

* cited by examiner

*Primary Examiner* — Rhonda S Peace

(57) ABSTRACT

An optical apparatus includes an optical resonator ring having at least one active region. The active region is configured to generate optical energy under an electrical stimulus. The optical apparatus also includes a corrugated plasmonic body disposed around at least a portion of the resonator ring and radiatively coupled to the active region.

21 Claims, 7 Drawing Sheets

RING LIGHT EMITTING DIODE

CROSS-REFERENCE TO RELATED APPLICATION

The present application claims priority from provisional application Ser. No. 61/047,046, filed Apr. 22, 2008, the contents of which are incorporated herein by reference in their entirety.

BACKGROUND

Light beams or optical signals are frequently used to transmit digital data, for example, in fiber optic systems for long-distance telephony and internet communication. Additionally, much research has been done regarding the use of optical signals to transmit data between electronic components on circuit boards.

Consequently, optical technology plays a significant role in modern telecommunications and data transmission. Examples of optical components used in such systems include optical or light sources such as light emitting diodes and lasers, waveguides, fiber optics, lenses and other optics, photo-detectors and other optical sensors, optically-sensitive semiconductors, optical modulators, and others.

Systems making use of optical components often rely upon the precise manipulation of optical energy, such as a beam of light, to accomplish a desired task. This is especially true in systems utilizing light for high-speed, low-energy communication between two nodes. Often light-emitting diodes and lasers are used to selectively emit light that may then be modulated with data and transmitted to a receiver.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
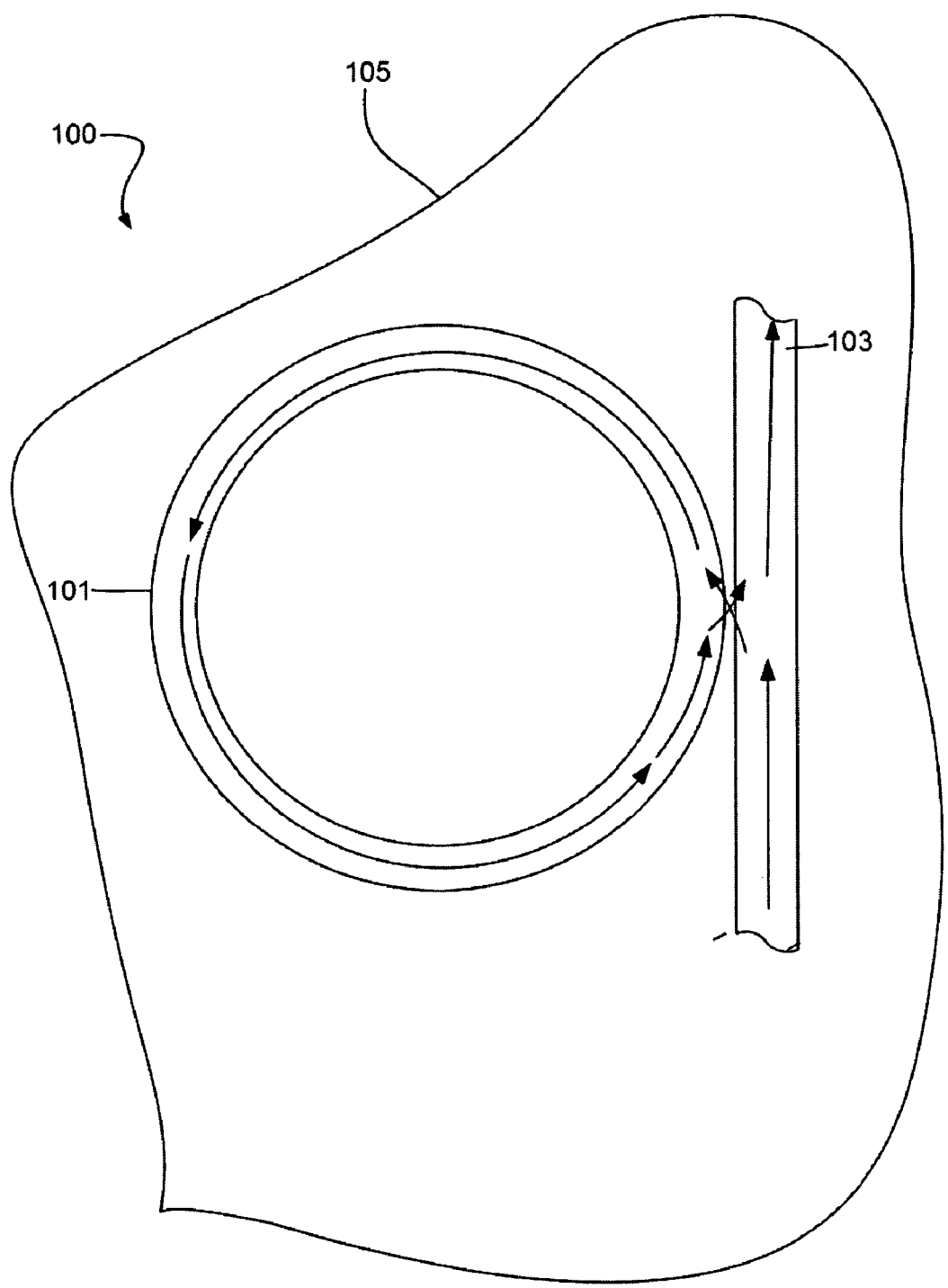
FIG. 1 is a diagram of an illustrative optical resonator, according to one embodiment of the principles described herein.

As described above, light emitting diodes may be used in many different optical devices. In some cases, such as some optical data transmission applications, it may be desirable that light-emitting diodes be able to switch on and off at very rapid rates. It may also be desirable to efficiently couple light generated by a light emitting diode into an optical waveguide.

To accomplish these and other goals, the present specification discloses an optical apparatus in which light is generated in a resonator ring having at least one quantum well. A metallic, corrugated body surrounds at least a portion of the resonator ring, and the resonator ring is radiatively coupled to surface plasmons of the corrugated body. By coupling the resonator ring to the surface plasmons of the corrugated body, the fall-off time of an optical pulse produced by the resonator ring may be reduced, thereby increasing the rate at which distinct pulses can be generated to transmit data. The resonator ring may also be optically coupled to a tangential waveguide.

As used in the present specification and in the appended claims, the term "optical energy" refers to radiated energy having a wavelength generally between 10 nanometers and 500 microns. Optical energy as thus defined includes, but is not limited to, ultraviolet, visible, and infrared light. A beam of optical energy may be referred to herein as a "light beam" or "optical beam."

As used in the present specification and in the appended claims, the term "optically coupled" refers to the physical proximity and orientation of at least two optically conductive objects such that an appreciable optical signal through one of the objects is at least partially received in the other of the objects. Similarly, the more general term "radiatively coupled" refers to the physical proximity and orientation of at least two objects such that an appreciable amount of radiated energy from one of the objects is at least partially received in the other of the objects.

As used in the present specification and in the appended claims, the term "plasmon" refers to collective oscillations of the free electron gas density of a body. Often, these oscillations may occur at optical frequencies. The term "plasmonic body" as used herein refers to a body characterized by the existence of plasmons. For example, metallic bodies are plasmonic bodies.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

The optical systems and methods described in the present specification include extensions to the principles of operation of an optical ring resonator. Accordingly, the operation of an illustrative optical ring resonator will first be discussed, after which the principles disclosed in the present specification will be discussed in more detail with respect to illustrative ring LED systems and methods.

Illustrative Optical Ring Resonator

Referring now to FIG. 1, a diagram of an illustrative optical ring resonator (100) is shown. The optical resonator (100) may have a first optical waveguide arranged in a loop to form a resonator ring (101). A second, tangential optical waveguide (103) is arranged tangential to, and is optically coupled with, the resonator ring (101). In various embodiments, this tangential arrangement provides for the overlap of corresponding evanescent regions in the resonator ring (101) and the tangential waveguide (103). This overlap of corresponding evanescent regions allows optical energy traveling through the tangential waveguide (103) to be coupled into and then travel through the resonator ring (101) and vice versa. This is true even though the waveguides of the resonator ring (101) and tangential waveguide (103) are not mechanically coupled.

The resonator ring (101) and the tangential waveguide (103) may include semiconductor materials, such as silicon, gallium arsenide, germanium, and the like. Furthermore, the resonator ring (101) and the tangential waveguide (103) may be fabricated on a substrate (105), such as silicon dioxide. In some embodiments, the substrate (105) may include a plurality of different regions. For example, the substrate (105) may include one or more insulating layers (e.g. silicon dioxide layers and the like), air gaps, trenches, metal layers, metal contacts, metal vias, doped regions of semiconductor material, and the like.

The resonator ring (101) will have a resonant frequency, which may be at least partially determined by the circumference of the ring (101), cross-sectional dimensions of the resonator ring (101) and the tangential waveguide (103), electrical charges, the material of which the resonator ring (101) and tangential waveguide (103) are fabricated, and the operating temperature of the optical resonator (100). The optical resonator (100) may be configured to sustain optical energy having a wavelength characteristic of the resonant frequency or a range of wavelengths above and below the resonant frequency. All other optical energy may be attenuated or suppressed in the resonator ring (101) by destructive interference.

In typical optical resonators (100), optical energy is generated by an optical source, such as a laser or a light emitting diode (LED), and enters the resonator (100) through an input end of the tangential waveguide (103). Optical energy having the correct wavelength (i.e. at or near the resonant frequency of the resonator ring (101)) may enter the resonator ring (101) at the tangential optical junction of the ring (101) and the tangential waveguide (103) and resonate through the loop of the resonator ring (101). Optical energy of other wavelengths may be dissipated through destructive interference and the intrinsic losses of the ring (101). The optical signals which are resonant with the ring (101) may then be transmitted through the tangential waveguide (103) to an optical receiver, such as a photodiode or another waveguide, disposed at a second end of the tangential waveguide (103). One potential path of optical energy traveling through the resonator (100) according to the present example is illustrated by the arrows in FIG. 1.

In contrast, the present specification discloses the concept of incorporating one or more light-emitting diodes directly into a resonator ring (101), such that light generated by the light-emitting diode may be generated from within the ring (101) and couple to a tangential waveguide (103) as needed, for example, to effect data transmission.

Illustrative Ring LED Apparatus and Systems

Figure 2A:
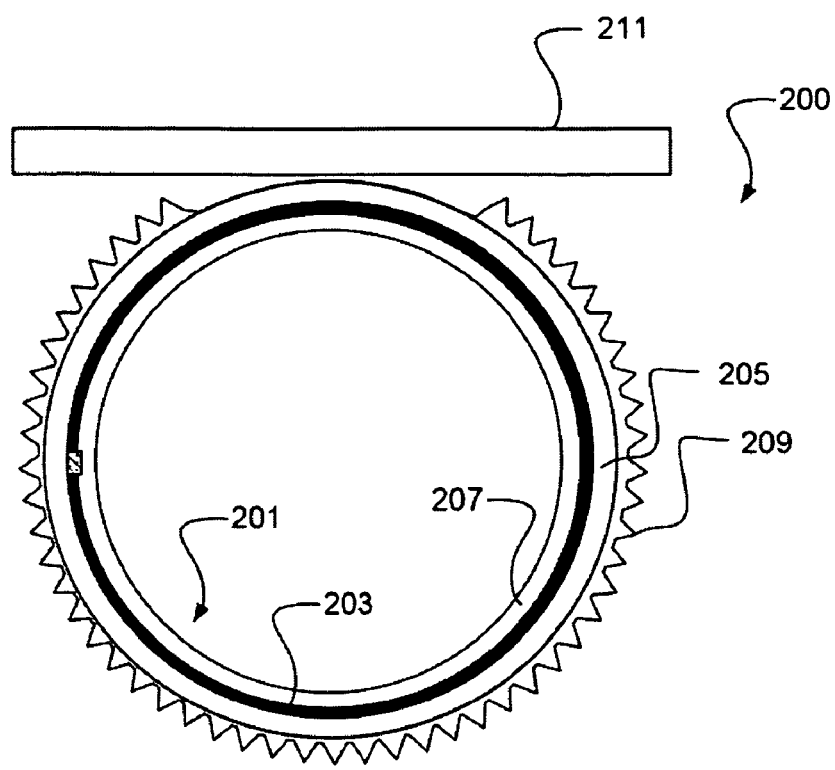
FIGS. 2A-2B are cross-sectional and top diagrams of an illustrative ring light emitting diode, according to one embodiment of the principles described herein.
Figure 2B:
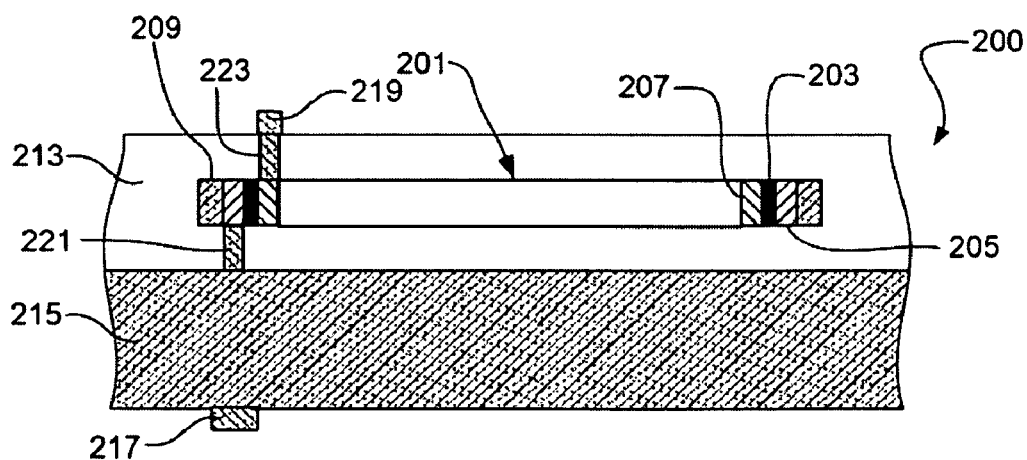

Referring now to FIGS. 2A-2B, an illustrative ring LED apparatus (200) is shown according to one embodiment of the principles described herein. FIG. 2A is a top view diagram of the illustrative apparatus (200), and FIG. 2B is a cross-sectional view of the illustrative apparatus (200). The apparatus (200) may include an optical resonator ring (201) having at least one active region (203). In certain embodiments, the active region (203) may include one or more quantum wells.

The active region (203) is configured to emit optical energy under an electrical stimulus. For example, a region of n-doped semiconductor (205) may be disposed along a first surface of the active region (203), and a region of p-doped semiconductor (207) may be disposed along a second surface of the active region (203) such that each of the doped semiconductor regions (205, 207) is in electrical communication with the active region (203). The electrical stimulus that causes the active region (203) to emit optical energy may occur when a positive voltage differential is applied between the region of p-doped semiconductor (207) and the region of n-doped semiconductor (205), thus allowing current to flow through the active region (203) from the region of p-doped semiconductor (207) to the region of n-doped semiconductor (205), when the semiconductor has direct band gap.

By applying the voltage potential between the doped regions (207, 205), the one or more quantum wells in the active region (203) may be infused with positive and negative charge carriers that subsequently recombine and release photons of optical energy having an optical frequency, and therefore color, dependent on the characteristic bandgaps of the material from which the active region (203) is fabricated. Consequently, the active region (203) and the surrounding doped regions (207, 205) constitute a light emitting diode (LED).

A corrugated plasmonic body (209) may be disposed around at least a portion of the resonator ring (201) and radiatively coupled to the active region (203) of the resonator ring (201). Surface plasmons may be disposed on the plasmonic body (209) so as to create a radiative coupling with the optical modes in the resonator ring (201). In this way, carrier recombination in the active region (203) may excite the surface plasmons of the plasmonic body (209) which may then reradiate the power and enhance the recombination speed of carriers in the active region (203).

When the active region (203) does not have direct band gap (like in silicon or germanium), strong biasing is required to generate carrier multiplication and light emission by direct radiative transitions of hot electrons. This light emission is characterized by low efficiency. This low efficiency can be improved, however, many times by using radiative coupling to the surface plasmon polaritons excited at the semiconductor (205)/corrugated metal ring (209) interface. The coupling shortens the fall-off time of the radiation to speed-up the switching time of the LED.

Thus, the end effect of this surface plasmon coupling to the optical modes of the active region (203) may be that the fall-off time of a radiation pulse caused by an electrical stimulus may be significantly reduced. This reduction in the fall-off time may provide for enhanced speed in switching the LED apparatus (200) on and off, which may allow for very high data transmission rates when data is modulated onto a beam of optical energy by selectively switching the LED apparatus (200) on and off.

As noted above, the plasmonic body (209) may be corrugated such that the harmonics of the periodicity in the corrugation may add to the wave vector of photons generated by the active region (203), thus enabling the photons to effectively couple to the surface plasmons of the plasmonic body (209). In certain embodiments, the plasmonic body (209) may include at least one or more of: silver, gold, copper, titanium, and chromium, or other suitable material.

Delta doping may be used in at least the region of n-doped semiconductor (205). This will reduce Schottky barrier and related effects that may cause a depletion layer in the region of n-doped semiconductor (205) and detrimentally interact with surface plasmons of the plasmonic body (209).

Once the optical energy is generated by the active region (203), it may propagate through the resonator ring (201). The resonator ring (201) may be configured to resonate at approximately the same frequency as that of the photons emitted by the active region (203).

Optical energy generated by the active layer (203) may be received into a tangential waveguide (211) that is optically coupled with the resonator ring (201) as described above. The tangential waveguide (211) may then guide the optical energy generated by the active layer (203) to an optical receiver, such as a photodiode and/or another optical waveguide.

The ring LED apparatus (200) of the present example may be disposed within an insulating layer (213) fabricated on a semiconductor substrate (215). Metal contacts (217, 219) and vias (221, 223) may provide electrical connectivity to the region of n-doped semiconductor (205) and the region of p-doped semiconductor (207). In the present embodiment, the semiconductor substrate (215) may be n-doped and thus be part of the electrical path between the region of n-doped semiconductor (205) and the metal contact (217).

Figure 3A:
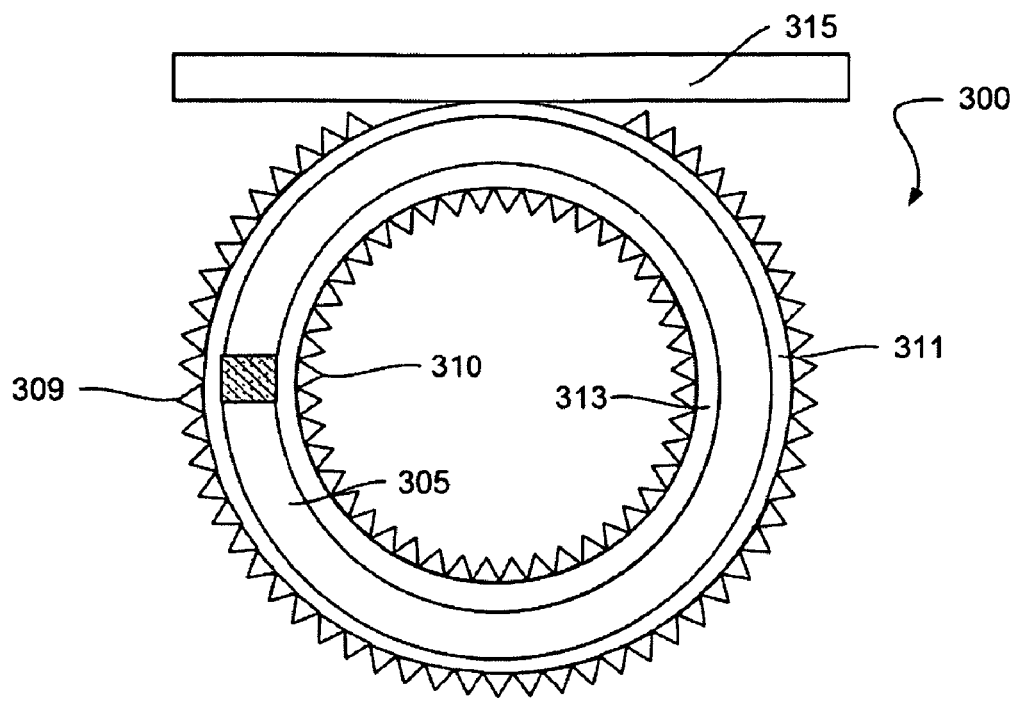
FIGS. 3A-3B are cross-sectional and top diagrams of an illustrative ring light emitting diode, according to one embodiment of the principles described herein.
Figure 3B:
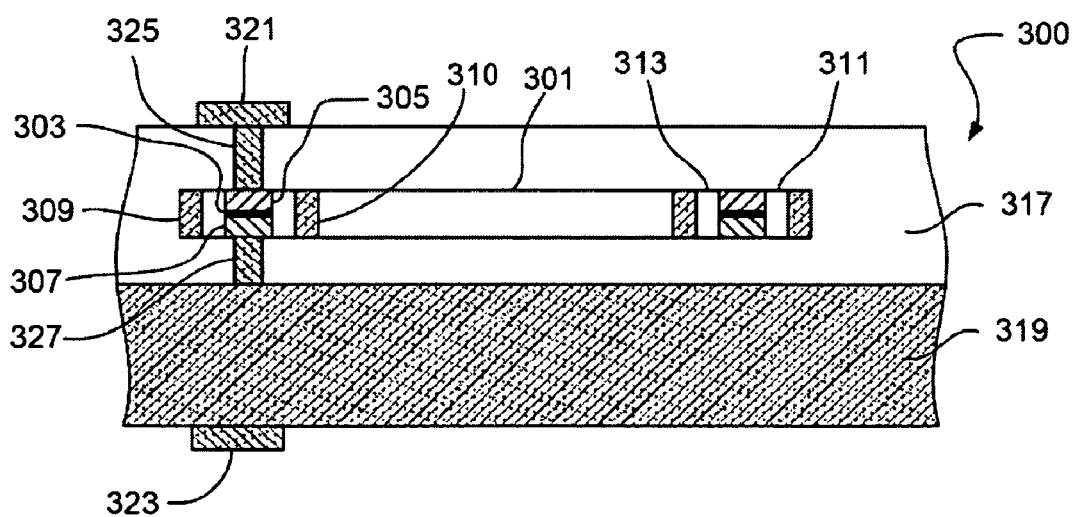

Referring now to FIGS. 3A-3B, another illustrative ring LED apparatus (300) is shown. FIG. 3A is a top view diagram of the illustrative apparatus (300), and FIG. 3B is a cross-sectional view of the illustrative apparatus (300).

Similar to the ring LED apparatus (200, FIG. 2) described above, the ring LED apparatus (300) of the present example may include an optical resonator ring (301) having at least one active region (303). In certain embodiments, the active region (303) may include one or more quantum wells.

Like the ring LED apparatus (200, FIG. 2) described previously, the present ring LED apparatus (300) may include a region (305) of n-doped semiconductor disposed along a first surface of the active region (303), and a region of p-doped semiconductor (307) disposed along a second surface of the active region (303) such that each of the doped semiconductor regions (305,. 307) is in electrical communication with the active region (303).

In contrast with the previous example, the regions of doped semiconductor (305, 307) of the present ring LED apparatus (300) may be disposed vertically in layers above and below the active region (303), respectively.

Outer and inner corrugated plasmonic bodies (309, 310) may be disposed around at least a portion of the resonator ring (301) and radiatively coupled to the active region (303) of the resonator ring (301). The active region (303) may be insulated electrically from the corrugated plasmonic bodies (309, 310) by insulating layers (311, 313) made of an insulating material such as silicon dioxide.

As in previous examples, a tangential waveguide (315) is disposed alongside the resonator ring (301). Optical energy generated by the active region (303) may be received into a tangential waveguide (315) that is in optical communication with the resonator ring (301).

The ring LED apparatus (300) of the present example may also be disposed within an insulating layer (317) fabricated on a semiconductor substrate (319). Metal contacts (321, 323) and vias (325, 327) may provide electrical connectivity to the region of n-doped semiconductor (305) and the region of the p-doped semiconductor (307). In the present embodiment, the semiconductor substrate (319) may be p-doped and thus be part of the electrical path between the region of p-doped semiconductor (307) and the metal contact (323).

Figure 4:
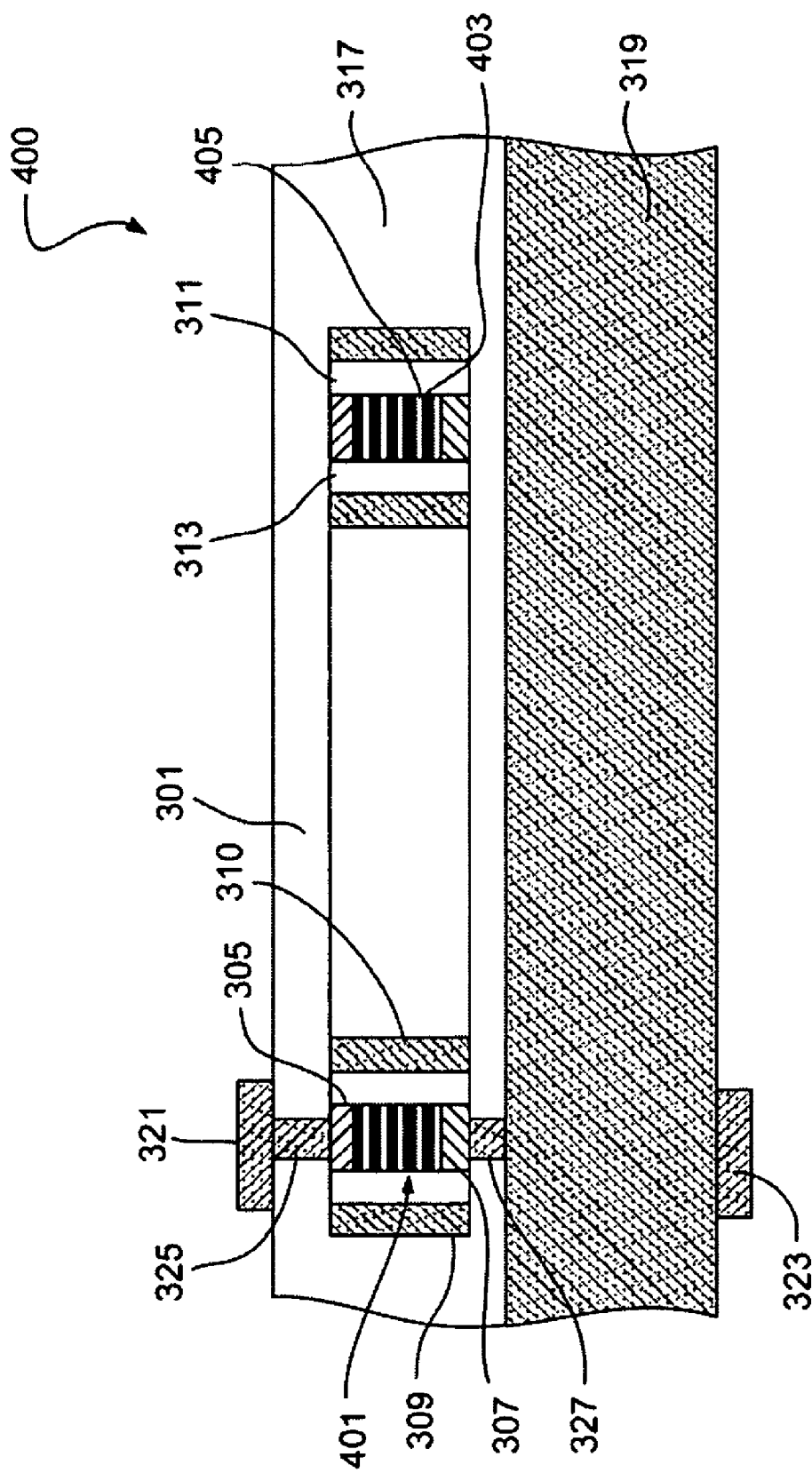
FIG. 4 is a cross-sectional diagram of an illustrative ring light emitting diode, according to one embodiment of the principles described herein.

Referring now to FIG. 4, another illustrative ring LED apparatus (400) is shown. The ring LED apparatus (400) of the present example is similar in construction to the ring LED apparatus (300, FIG. 3) described previously.

In contrast to the previous example (300, FIG. 3), however, the present ring LED apparatus (400) includes an active region (401) that includes a plurality of quantum wells (403). Barrier layers (405) may be disposed between the quantum wells (403). The additional quantum wells (403) may increase the optical energy production of the LED apparatus (400).

Figure 5:
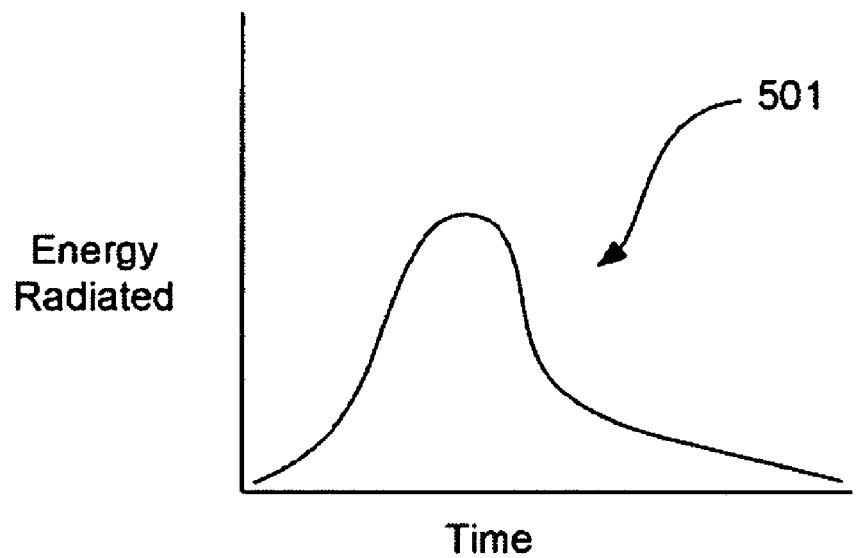
FIG. 5 is a diagram of illustrative fall-off times for radiation pulses from different light-emitting diodes, according to one embodiment of the principles described herein.
Figure 5:
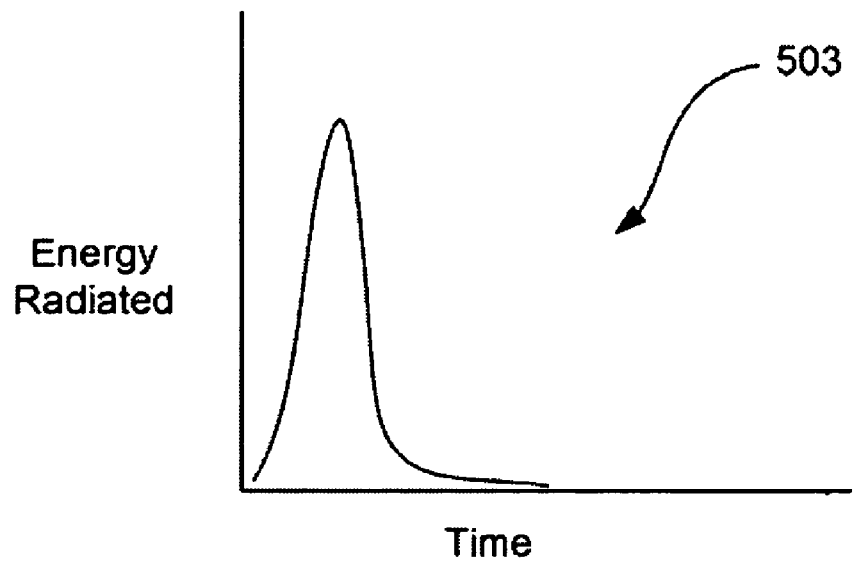

Referring now to FIG. 5, a comparison is shown between the amount of optical energy radiated and the radiative fall-off times between a prior art LED (501) without a ring structure and a corrugated plasmonic body (209, FIG. 2) radiatively coupled to an active region and an LED (503) having a corrugated plasmonic body (209, FIG. 2) and ring structure according to the principles described herein. A similar driving electrical pulse is applied to each of the LEDs (501, 503).

As shown, the prior art LED (501) emits optical energy much slower than the LED (503) with the corrugated plasmonic body 209, FIG. 2) and ring structure. Additionally, the LED (503) with the corrugated plasmonic body (209, FIG. 2) and ring structure has a much shorter radiative fall-off time than the prior art LED (501). Thus, an LED (503) having the corrugated plasmonic body (209, FIG. 2) and ring structure may perform much more efficiently and quickly than a prior art LED that does not incorporate these features.

Figure 6:
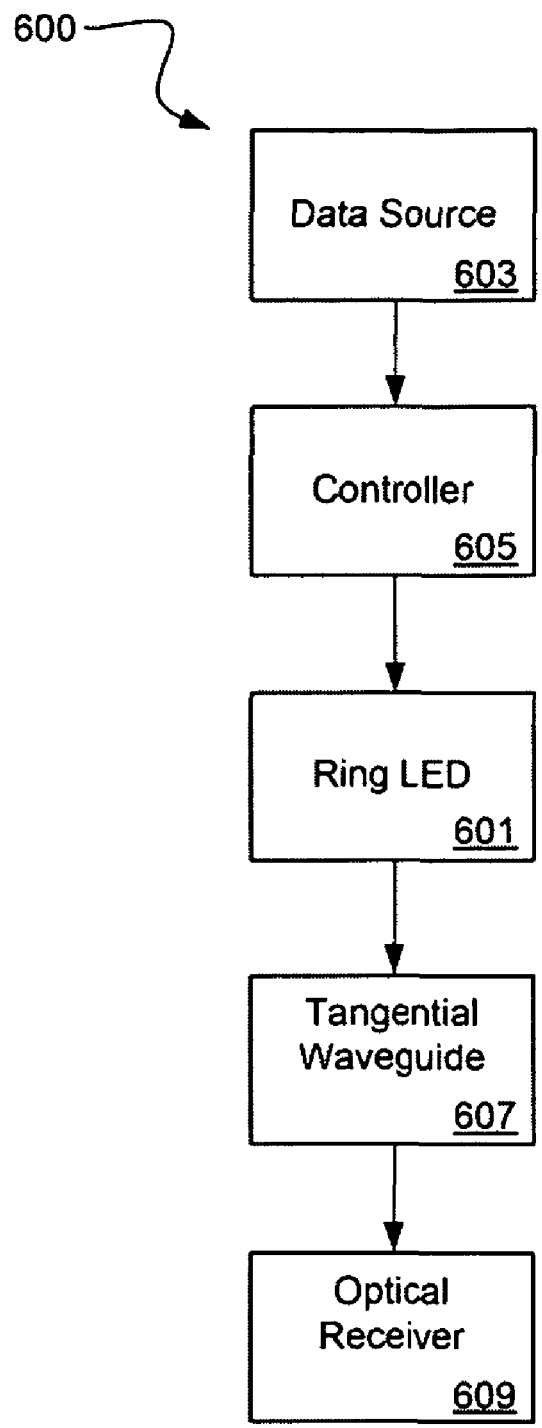
FIG. 6 is a block diagram of an illustrative system for transmitting optical data, according to one embodiment of the principles described herein.

Referring now to FIG. 6, a block diagram of an illustrative optical system (600) incorporating a ring LED (601) is shown according to the principles described herein.

In the illustrative optical system (600), a data source (603) provides data to a controller (605) configured to provide the necessary electrical modulation signal to the ring LED (601). The data source (603) may be an electronic component such as a processor, microcontroller, application specific integrated circuit (ASIC), and/or a memory storage device. The data source (603) may provide data to the controller (605) for transmission to a recipient device, such as another electronic component.

The controller (605) may be in communication with the ring LED (601) and translate electronic data received from the data source (603) into a driving signal for the ring LED (601) that causes the LED (601) to produce a modulated optical signal bearing the data from the data source (603). A variety of known methods may be used to accomplish this conversion.

For example, in certain embodiments the controller (605) may selectively provide the active region of the ring LED (601) with the electronic stimulus needed to produce optical energy within the ring LED (601). This may be done in a pattern representative of the data to be modulated optically. In other embodiments, the controller (605) may be configured to selectively tune the resonant frequency of the resonator ring in the ring LED (601) by altering the temperature of the ring LED (601) or injecting charge into the ring LED (601).

The ring LED (601) may be optically coupled to a tangential waveguide (607) according to principles described previously. The tangential waveguide (607) may receive the modulated optical energy from the ring LED (601) and transmit the energy to an optical receiver (609), such as a photodiode, a waveguide, and/or another optical component. The ring LED (601) may be fabricated with a high quality factor and able to produce a periodic series of light pulses, per one voltage pulse to bias the LED, out-coupled into the tangential waveguide (607), that may be used for a variety of purposes. For example, in some embodiments the light pulses may be used for clock distribution in an electronic system.

Illustrative Methods

Figure 7:
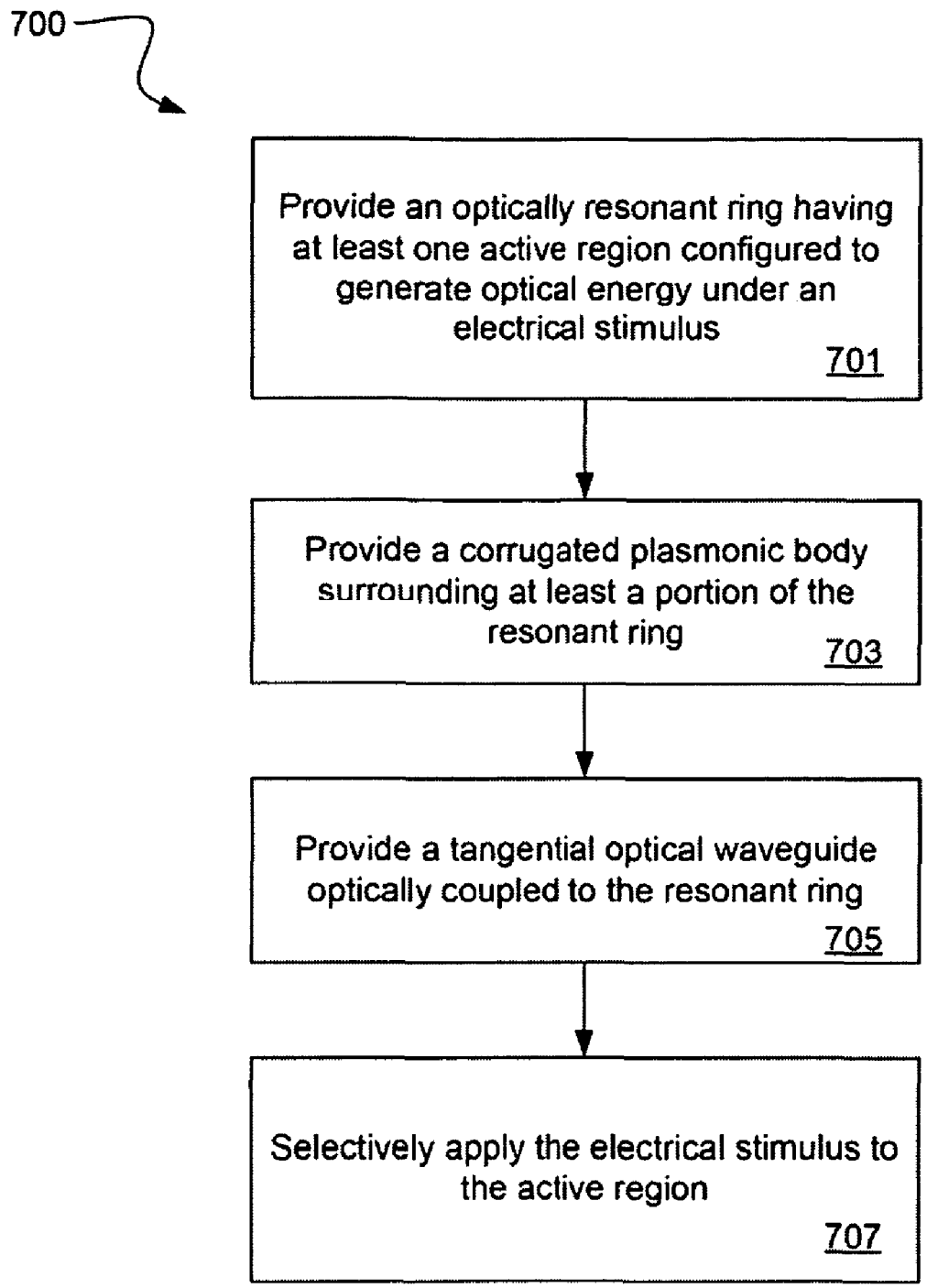
FIG. 7 is a flowchart diagram of an illustrative method of radiating light, according to one embodiment of the principles described herein.

Referring now to FIG. 7, a flowchart of an illustrative method (700) of optical communication is shown. The method (700) may include providing (step 701) an optical resonator ring having at least one active region configured to generate optical energy under an electrical stimulus. In certain embodiments, the electrical stimulus may include applying a voltage potential between an n-doped region in electrical communication with a first surface of the active region and a p-doped region in electrical communication with a second surface of the active region.

A corrugated plasmonic body surrounding at least a portion of the resonator ring may then be provided (step 703). The corrugated plasmonic body may be in optical communication with the active region of the resonator ring such that surface plasmons on the corrugated plasmonic body interact with photons generated in the active region to enhance the emissive properties of the active region.

A tangential optical waveguide optically coupled to the resonator ring may then be provided (step 705). The electrical stimulus may then be selectively applied (step 707) to the active region of the resonator ring. In certain embodiments this may be done to modulate data optically. The optical energy generated in the active region by the electrical stimulus may then be received in the tangential waveguide.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An optical apparatus, comprising:
   an optical resonator ring comprising at least one active region; wherein said active region generates optical energy under an electrical stimulus; and
   a corrugated plasmonic body curved around at least a portion of said resonator ring and radiatively coupled to said active region.

2. The optical apparatus of claim 1, wherein said optical resonator ring further comprises:
   a region of n-doped semiconductor disposed along a first surface of said active region and in electrical communication with said active region; and
   a region of p-doped semiconductor disposed along a second surface of said active region and in electrical communication with said active region.

3. The optical apparatus of claim 1, wherein said corrugated plasmonic body reduces a fall-off time of an optical energy pulse generated by said active region.

4. The optical apparatus of claim 1, wherein said active region comprises at least one quantum well.

5. The optical apparatus of claim 4, wherein said quantum well comprises gallium arsenide.

6. The optical apparatus of claim 1, wherein said plasmonic body comprises at least one metal selected from the group consisting of: silver, gold, copper, titanium, and chromium.

7. The optical apparatus of claim 1, further comprising an electrically insulating layer between said active region and said plasmonic body.

8. The optical apparatus of claim 1, further comprising an optical waveguide tangential to and optically coupled to said resonator ring.

9. The optical apparatus of claim 1, wherein ridges of said corrugated plasmonic body extend radially with respect to said resonator ring.

10. An optical system, comprising:
    an optical resonator ring comprising at least one active region; wherein said active region is configured to generate optical energy under an electrical stimulus;
    a corrugated plasmonic body disposed around at least a portion of said resonator ring and radiatively coupled to said resonator ring; and
    an electronic controller configured to selectively apply said stimulus to said active region.

11. The optical system of claim 10, wherein said ring further comprises:
    a region of n-doped semiconductor disposed along a first surface of said active region and in electrical communication with said active region; and
    wherein said ring further comprises a region of p-doped semiconductor disposed along a second surface of said active region and in electrical communication with said optical resonator ring.

12. The optical system of claim 11, wherein said stimulus comprises a voltage applied between said region of n-doped semiconductor and said region of p-doped semiconductor.

13. The optical system of claim 10, wherein said corrugated plasmonic body reduces a fall-off time of an optical energy pulse generated by said active region.

14. The optical system of claim 10, wherein said active region comprises at least one quantum well.

15. The optical system of claim 14, wherein said controller is configured to modulate data onto said optical energy generated by said quantum well by selectively applying said stimulus.

16. The optical system of claim 10, wherein said plasmonic body comprises at least one metal selected from the group consisting of: silver, gold, copper, titanium, and chromium.

17. The optical system of claim 10, further comprising an optical waveguide tangential to and optically coupled to said resonator ring.

18. A method, comprising:
    providing an optical resonator ring comprising at least one active region that generates optical energy under an electrical stimulus;
    providing a corrugated plasmonic body curved around at least a portion of said resonator ring; and
    selectively applying said electrical stimulus to said active layer.

19. The method of claim 18, wherein said electrical stimulus comprises a voltage potential between an n-doped region in electrical communication with a first surface of said active region and a p-doped region in electrical communication with a second surface of said active region.

20. The method of claim 18, wherein said electrical stimulus is selectively applied to modulate data onto said optical energy.

21. The method of claim 18, further comprising reducing a fall-off time of an optical energy pulse generated by said active region using said corrugated plasmonic body.

* * * * *